US012652863B2

(12) United States Patent
Guo et al.

(10) Patent No.: US 12,652,863 B2
(45) Date of Patent: Jun. 9, 2026

(54) PHOTOVOLTAIC MODULE AND PRODUCTION METHOD FOR THE SAME

(71) Applicant: ZHEJIANG JINKO SOLAR CO., LTD., Haining (CN)

(72) Inventors: Zhiqiu Guo, Haining (CN); Yidong Hu, Haining (CN); Qingbo Li, Haining (CN)

(73) Assignee: ZHEJIANG JINKO SOLAR CO., LTD., Haining (CN)

( * ) Notice: Subject to any disclaimer, the term of this patent is extended or adjusted under 35 U.S.C. 154(b) by 342 days.

(21) Appl. No.: 18/313,298

(22) Filed: May 5, 2023

(65) Prior Publication Data

US 2024/0204124 A1     Jun. 20, 2024

(30) Foreign Application Priority Data

Dec. 15, 2022     (CN) .......................... 202211611174.2

(51) Int. Cl.
*H10F 19/90* (2025.01)
*H10F 19/80* (2025.01)
*H10F 71/00* (2025.01)

(52) U.S. Cl.
CPC ........... *H10F 19/904* (2025.01); *H10F 19/80* (2025.01); *H10F 71/00* (2025.01)

(58) Field of Classification Search
CPC ......... Y02E 10/50; H02S 20/23; H10F 71/00; H10F 19/00; H10F 19/80; H10F 19/90; H10F 19/902; H10F 19/904
See application file for complete search history.

(56) References Cited

U.S. PATENT DOCUMENTS

2012/0325282 A1     12/2012  Snow et al.
2017/0125619 A1*     5/2017  Nakano ................. H10F 77/244
(Continued)

FOREIGN PATENT DOCUMENTS

CN          106489211 A       3/2017
CN          109746599 A       5/2019
(Continued)

OTHER PUBLICATIONS

Machine translation of CN-111223950-A, Huang, Zhao-ping. (Year: 2020).*

(Continued)

*Primary Examiner* — Mayla Gonzalez Ramos
(74) *Attorney, Agent, or Firm* — USCH Law, PC

(57)     ABSTRACT

Embodiments of the present disclosure provide a method for producing a photovoltaic module and a photovoltaic module. The method includes: providing a plurality of solar cells, each respective solar cell has an overlapping area; applying adhesive to first areas in the overlapping area of each solar cell, the first areas allow the respective solar cell to be welded to a neighboring solar cell through a plurality of welding strips; in response to hardness of the adhesive falling in a preset hardness range by curing, welding the respective solar cell to the neighboring solar cell through the plurality of welding strips, to obtain at least one cell string; and laminating a front encapsulation layer, a front encapsulation material, the at least one cell string, a rear encapsulation material and a rear encapsulation layer, to obtain the photovoltaic module.

14 Claims, 8 Drawing Sheets

(56)                References Cited

U.S. PATENT DOCUMENTS

| | | | | |
|---|---|---|---|---|
| 2019/0386604 | A1* | 12/2019 | Nadimpally | .......... H10F 19/902 |
| 2020/0243704 | A1* | 7/2020 | Krajewski | ................ C09J 7/381 |
| 2023/0146682 | A1* | 5/2023 | Chen | ....................... H10F 19/00 |
| | | | | 136/251 |

FOREIGN PATENT DOCUMENTS

| | | | | | |
|---|---|---|---|---|---|
| CN | 110828600 | A | | 2/2020 | |
| CN | 111223950 | A | * | 6/2020 | ............ H10F 19/40 |
| CN | 113178503 | A | | 7/2021 | |
| CN | 113594302 | A | * | 11/2021 | ............ H10F 19/80 |
| CN | 114335246 | A | | 4/2022 | |
| CN | 114512573 | A | | 5/2022 | |

OTHER PUBLICATIONS

Machine translation of CN-113594302-A, Qi, Pei-dong. (Year: 2021).*
Zhejiang Jinko Solar Co., Ltd., Extended European Search Report, EP 23172547.4, Oct. 26, 2023, 8 pgs.

* cited by examiner

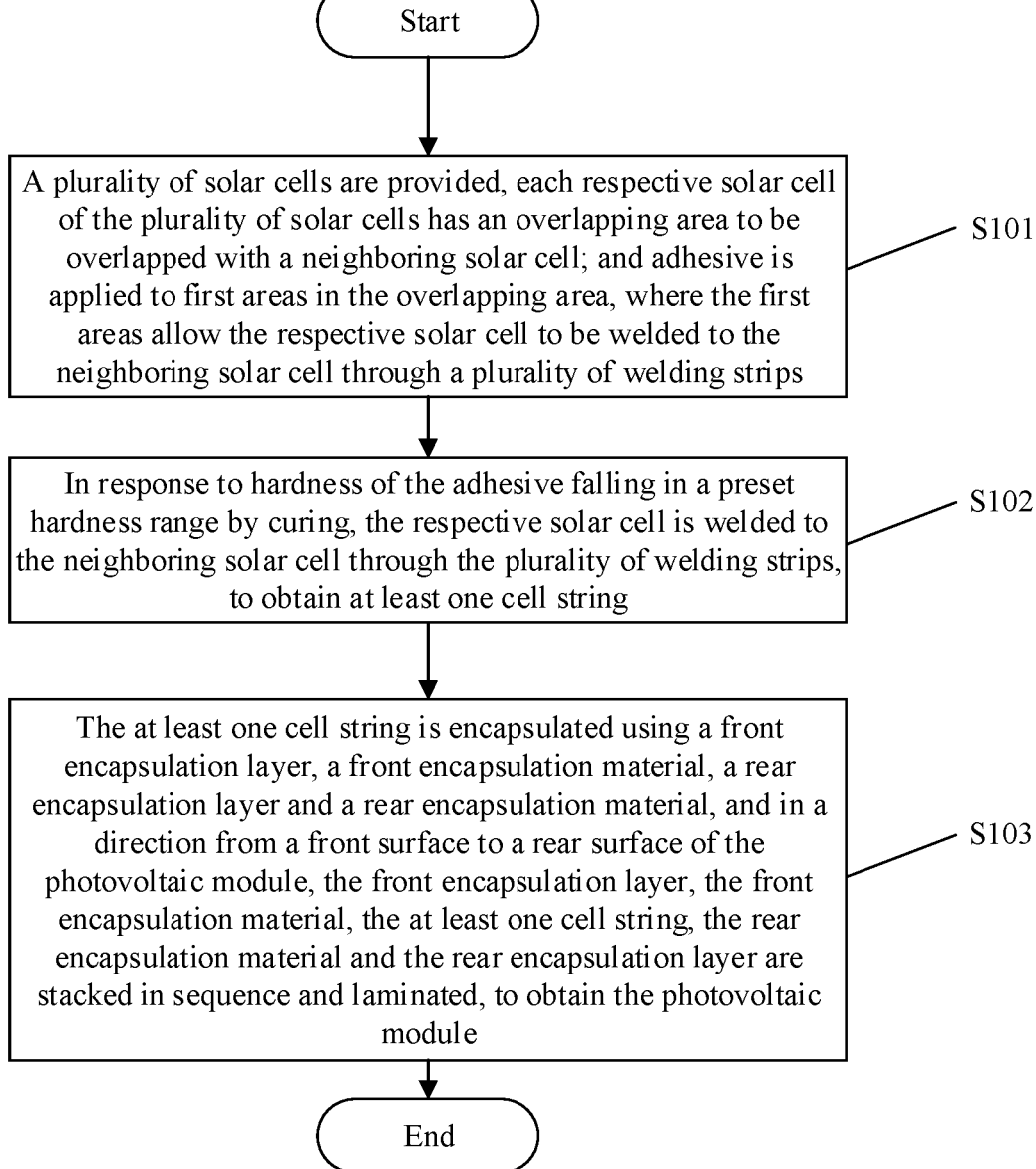

Start

A plurality of solar cells are provided, each respective solar cell of the plurality of solar cells has an overlapping area to be overlapped with a neighboring solar cell; and adhesive is applied to first areas in the overlapping area, where the first areas allow the respective solar cell to be welded to the neighboring solar cell through a plurality of welding strips — S101

In response to hardness of the adhesive falling in a preset hardness range by curing, the respective solar cell is welded to the neighboring solar cell through the plurality of welding strips, to obtain at least one cell string — S102

The at least one cell string is encapsulated using a front encapsulation layer, a front encapsulation material, a rear encapsulation layer and a rear encapsulation material, and in a direction from a front surface to a rear surface of the photovoltaic module, the front encapsulation layer, the front encapsulation material, the at least one cell string, the rear encapsulation material and the rear encapsulation layer are stacked in sequence and laminated, to obtain the photovoltaic module — S103

End

FIG. 1

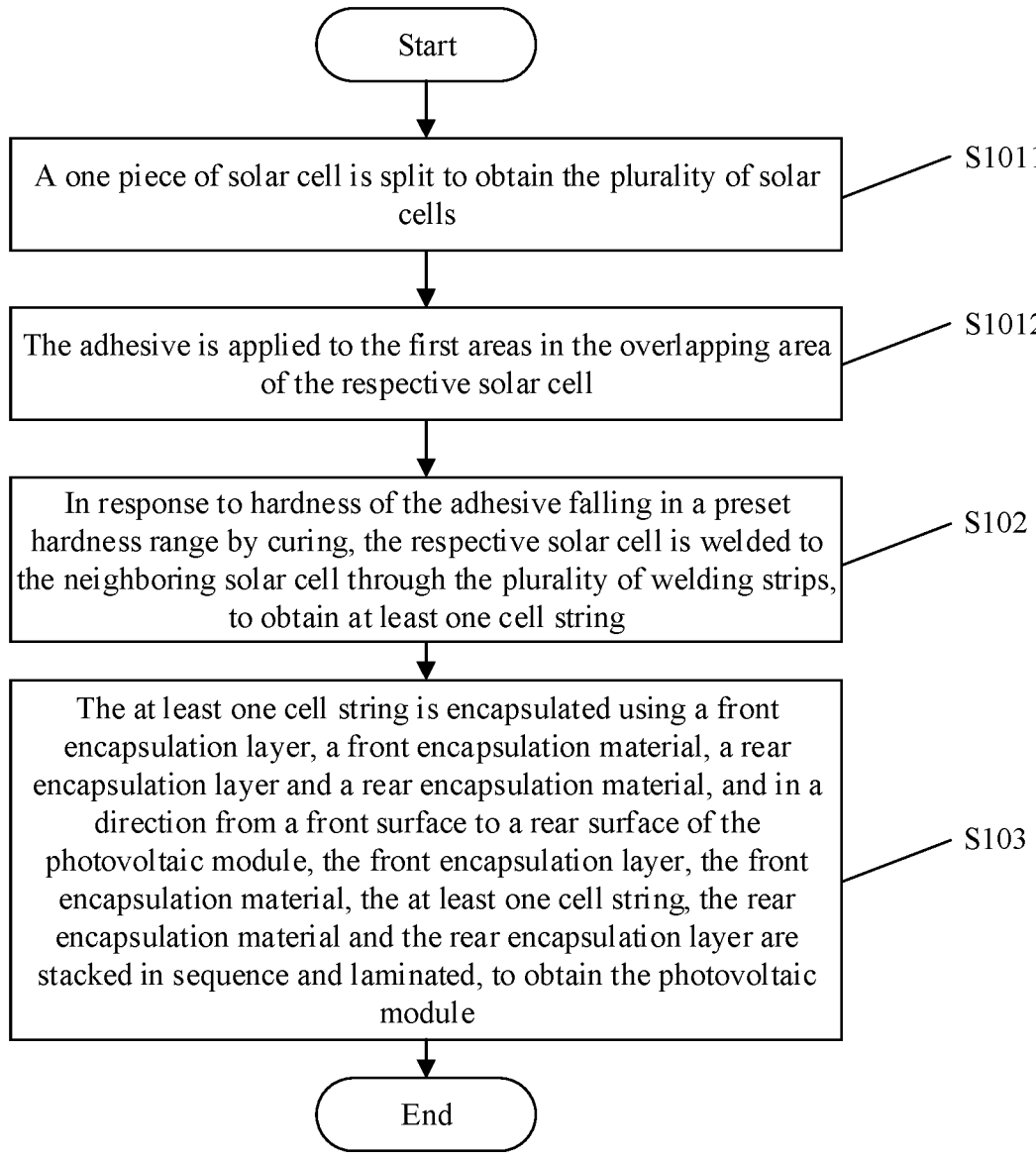

Start

A one piece of solar cell is split to obtain the plurality of solar cells — S1011

The adhesive is applied to the first areas in the overlapping area of the respective solar cell — S1012

In response to hardness of the adhesive falling in a preset hardness range by curing, the respective solar cell is welded to the neighboring solar cell through the plurality of welding strips, to obtain at least one cell string — S102

The at least one cell string is encapsulated using a front encapsulation layer, a front encapsulation material, a rear encapsulation layer and a rear encapsulation material, and in a direction from a front surface to a rear surface of the photovoltaic module, the front encapsulation layer, the front encapsulation material, the at least one cell string, the rear encapsulation material and the rear encapsulation layer are stacked in sequence and laminated, to obtain the photovoltaic module — S103

End

FIG. 3

Start

The adhesive is applied to the at least one applying area of the one piece of solar cell, and the at least one applying area corresponds to first areas of the plurality of solar cells — S1013

The one piece of solar cell is split to obtain the plurality of solar cells, and the first areas of each solar cell of the plurality of solar cells have the adhesive — S1014

In response to hardness of the adhesive falling in a preset hardness range by curing, the respective solar cell is welded to the neighboring solar cell through the plurality of welding strips, to obtain at least one cell string — S102

The at least one cell string is encapsulated using a front encapsulation layer, a front encapsulation material, a rear encapsulation layer and a rear encapsulation material, and in a direction from a front surface to a rear surface of the photovoltaic module, the front encapsulation layer, the front encapsulation material, the at least one cell string, the rear encapsulation material and the rear encapsulation layer are stacked in sequence and laminated, to obtain the photovoltaic module — S103

End

FIG. 4

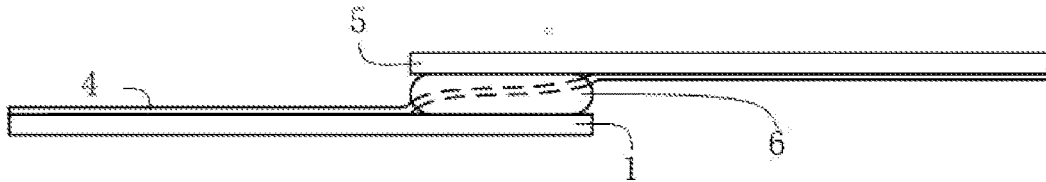

FIG. 5

Start

A plurality of solar cells are provided and disposed in a non-overlapped manner, and adhesive is applied to a fifth area of each respective solar cell, where the fifth area is configured for the respective solar cell and a neighboring solar cell to be welded to each other in the fifth area through a plurality of welding strips

S301

In response to hardness of the adhesive falling in a preset hardness range by curing, the respective solar cell and the neighboring solar cell are welded to each other through the plurality of welding strips, to obtain at least one cell string

S302

The at least one cell string is encapsulated using a front encapsulation layer, a front encapsulation material, a rear encapsulation layer and a rear encapsulation material, and in a direction from a front surface to a rear surface of the photovoltaic module, the front encapsulation layer, the front encapsulation material, the at least one cell string, the rear encapsulation material and the rear encapsulation layer are stacked in sequence and laminated, to obtain the photovoltaic module

S303

End

FIG. 8

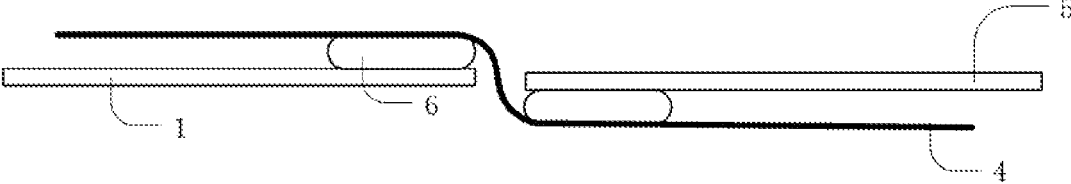

FIG. 9

PHOTOVOLTAIC MODULE AND PRODUCTION METHOD FOR THE SAME

CROSS REFERENCE TO RELATED APPLICATIONS

The present application claims the benefit of priority under the Paris Convention to Chinese Patent Application No. 202211611174.2 filed on Dec. 15, 2022, which is incorporated herein by reference in its entirety.

TECHNICAL FIELD

Embodiments of the present disclosure relate to the field of photovoltaic technology, and in particular to a method for producing a photovoltaic module and a photovoltaic module.

BACKGROUND

Solar photovoltaic modules are the core components of solar power generation systems, and are also the most important part of the solar power generation systems. Existing solar photovoltaic modules are made of silicon solar cells connected in series or in parallel, and sealed with glass, EVA, and rear plates.

An existing production process for conventional photovoltaic modules includes welding solar cells to form cell strings using welding strips, then connecting, in series or in parallel, a certain number of the cell strings connected in series, and encapsulating the cell strings with front and rear encapsulation materials.

SUMMARY

Embodiments of the present disclosure aim to provide a method for producing a photovoltaic module and a photovoltaic module, which can prevent cracks in solar cells during welding of the solar cells.

In order to solve the above problem, some embodiments of the present disclosure provide a method for producing a photovoltaic module, including:

providing a plurality of solar cells, each respective solar cell of the plurality of solar cells has an overlapping area to be overlapped with a neighboring solar cell of the plurality of solar cell;

for each respective solar cell of the plurality of solar cells:

applying adhesive to first areas in the overlapping area, where the first areas allow the respective solar cell to be welded to the neighboring solar cell through a plurality of welding strips disposed at intervals between the respective solar cell and the neighboring solar cell, and each welding strip of the plurality of welding strips extends from the respective solar cell to the neighboring solar cell and traverses a respective first area;

in response to hardness of the adhesive falling in a preset hardness range by curing, welding the respective solar cell to the neighboring solar cell through the plurality of welding strips, to obtain at least one cell string;

where the plurality of welding strips are separated from the respective solar cell and from the neighboring solar cell by the adhesive in the first areas;

encapsulating the at least one cell string using a front encapsulation layer, a front encapsulation material, a rear encapsulation layer and a rear encapsulation material, where the front encapsulation layer, the front encapsulation material, the at least one cell string, the rear encapsulation material and the rear encapsulation layer are stacked in sequence, in a direction from a front surface to a rear surface of the photovoltaic module; and laminating the front encapsulation layer, the front encapsulation material, the at least one cell string, the rear encapsulation material and the rear encapsulation layer, to obtain the photovoltaic module.

Some embodiments of the present disclosure provide a photovoltaic module, including: a front encapsulation layer, a front encapsulation material, at least one cell string, a rear encapsulation material, and a rear encapsulation layer, where the front encapsulation layer, the front encapsulation material, the at least one cell string, the rear encapsulation material and the rear encapsulation layer are stacked in sequence in a direction from a front surface to a rear surface of the photovoltaic module, and the at least one cell string includes a plurality of solar cells;

each respective solar cell of the plurality of solar cells has an overlapping area to be overlapped with a neighboring solar cell of the plurality of solar cells, and the respective solar cell has adhesive applied to first areas in the overlapping area;

the first areas allow the respective solar cell to be welded to the neighboring solar cell through a plurality of welding strips disposed at intervals between the respective solar cell and the neighboring solar cell, and each welding strip of the plurality of welding strips extends from the respective solar cell to the neighboring solar cell and traverses a respective first area;

the respective solar cell is welded to the neighboring solar cell through the plurality of welding strips to obtain at least one cell string; and the plurality of welding strips are separated from the respective solar cell and from the neighboring solar cell by the adhesive in the first areas.

BRIEF DESCRIPTION OF THE DRAWINGS

One or more embodiments are exemplarily illustrated in reference to corresponding accompanying drawing(s), and these exemplary illustrations do not constitute limitations on the embodiments.

FIG. 1 is a first flow chart of a method for producing a photovoltaic module according to some embodiments of the present disclosure.

FIG. 3 is a second flow chart of the method for producing a photovoltaic module according to some embodiments of the present disclosure.

FIG. 4 is a third flow chart of the method for producing a photovoltaic module according to some embodiments of the present disclosure.

FIG. 5 is a first cross-section view of a welding strip, adjacent solar cells and cured adhesive according to some embodiments of the present disclosure.

FIG. 8 is a fifth flow chart of the method for producing a photovoltaic module according to some embodiments of the present disclosure.

FIG. 9 is a second cross-section view of a welding strip, adjacent solar cells and cured adhesive according to some embodiments of the present disclosure.

DETAILED DESCRIPTION OF THE EMBODIMENTS

When a certain part "includes" another part throughout the specification, other parts are not excluded unless otherwise stated, and other parts may be further included. In addition, when parts such as a layer, a film, a region, or a plate is referred to as being "on" another part, it may be "directly on" another part or may have another part present therebetween. In addition, when a part of a layer, film, region, plate, etc., is "directly on" another part, it means that no other part is positioned therebetween.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise.

In order to make the objective, technical solutions and advantages of embodiments of the present disclosure more clear, the embodiments of the present disclosure will be described in detail below with reference to the accompanying drawings. Those skilled in the art should understand that, in the embodiments of the present disclosure, many technical details are provided for the reader to better understand the present disclosure. However, even without these technical details and various modifications and variants based on the following embodiments, the technical solutions claimed in the present disclosure can be implemented.

Some embodiments of the present disclosure relate to a method for producing a photovoltaic module, as shown in FIG. 1, the method includes the following operations.

At S101, a plurality of solar cells is provided, each respective solar cell of the plurality of solar cells has an overlapping area to be overlapped with a neighboring solar cell of the plurality of solar cells; and adhesive is applied to first areas in the overlapping area, where the first areas allow the respective solar cell to be welded to the neighboring solar cell through a plurality of welding strips disposed at intervals between the respective solar cell and the neighboring solar cell, and each welding strip of the plurality of welding strips extends from the respective solar cell to the neighboring solar cell and traverses a respective first area.

Figure 2:
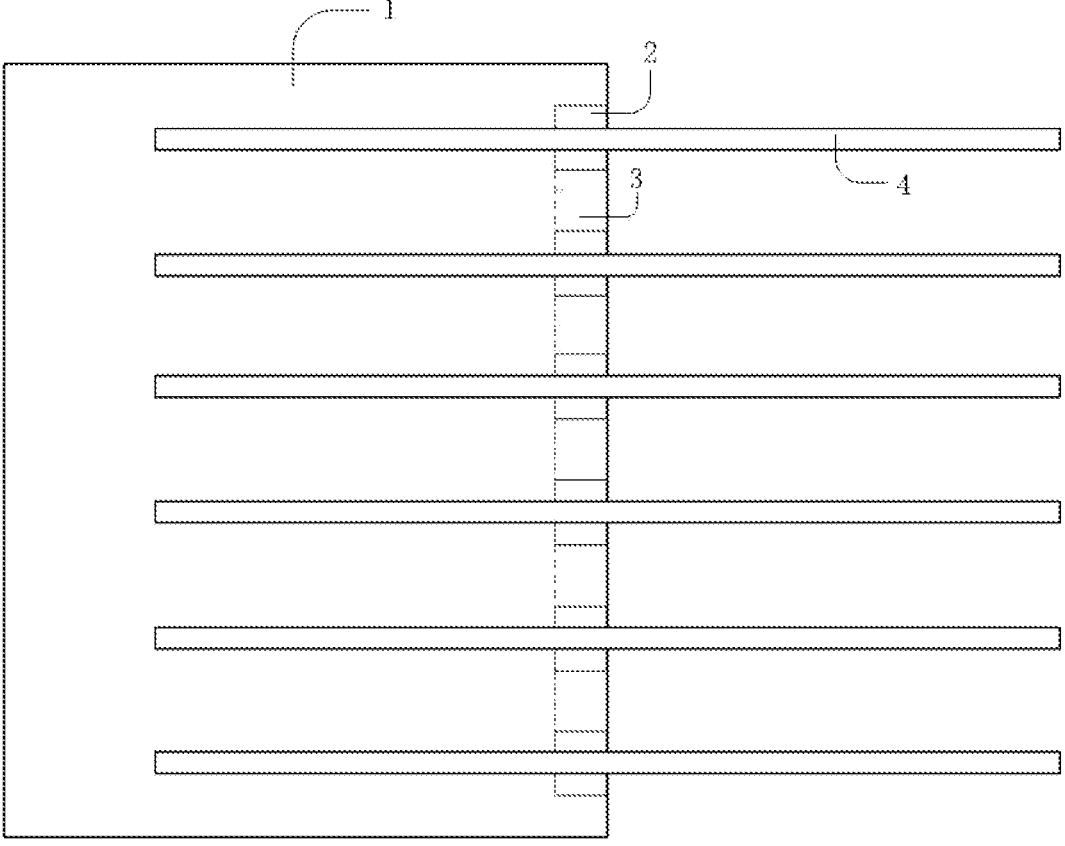
FIG. 2 is a first schematic diagram of an overlapping area of a first solar cell according to some embodiments of the present disclosure.

In some embodiments, referring to FIGS. 2 and 5, during manufacture of the photovoltaic module, a certain number of solar cells are overlapped with each other and connected in series, and a respective plurality of welding strips 4 are provided between each two adjacent solar cells to weld the two adjacent solar cells to each other. Throughout the embodiments of the present disclosure, a first solar cell 1 is introduced to denote a random solar cell of the provided plurality of solar cells, rather than a specific solar cell of the plurality of solar cells. For example, during processing of the plurality of solar cells in an overlapping order, a first solar cell may be selected as the first solar cell 1, and a next solar cell adjacent to the first solar cell 1 may be referred to a second solar cell 5. When process the second solar cell and a third solar cell adjacent to the second solar cell, the second and third solar cells form a new set of adjacent solar cells, in this case, the second solar cell 5 is referred to a first solar cell 1 of the new set of adjacent solar cells, and the third solar cell is referred to a second solar cell 5 of the new set of adjacent solar cells. For example, there are three solar cells A, B and C, solar cell A is adjacent to solar cell B, and the solar cell B is adjacent to solar cell C. When welding the solar cells A and B, the solar cell A which is processed firstly is referred to a first solar cell 1, and the solar cell B is referred to a second solar cell 5. Similarly, when welding the solar cells B and C, the solar cell B is referred to a first solar cell 1, and the solar cell C is referred to a second solar cell 5. In embodiments of the present disclosure, the first solar cell 1 is not intended to refer to a specific solar cell, and may denote a random solar cell to be welded except the last solar cell of a cell string.

In some embodiments, referring to FIG. 2, during welding the plurality of solar cells in series, each two adjacent solar cells are overlapped with each other on their edges, and edges of the two adjacent solar cells overlap with each other in the overlapping area. In an extension direction of the plurality of welding strips, a width of the overlapping area ranges from 0.3 mm to 2 mm, such as 0.5 mm, 1 mm, 1.5 mm or the like. A plurality of welding strips 4 disposed in an equidistant manner extends from one solar cell to the adjacent solar cell and traverses the overlapping area, to weld these two solar cells to each other in series. The overlapping area includes an area in which the plurality of welding strips 4 contact with the first solar cell and areas in which the plurality of welding strips 4 do not contact with the first solar cell, and the first area refers to the area in which the plurality of welding strips 4 contact with and are welded to the first solar cell.

At S102, referring to FIG. 5, in response to hardness of the adhesive 6 falling in a preset hardness range by curing, the respective solar cell (first solar cell 1) and the neighboring solar cell (second solar cell 5 adjacent to the first solar cell 1) are welded to each other through the plurality of welding strips 4, to obtain at least one cell string; the plurality of welding strips 4 are separated from the respective solar cell and from the neighboring solar cell by the adhesive 6 in the first areas.

In some embodiments, referring to FIG. 5, the adhesive 6 may be an insulating adhesive, such as thermoplastic resins including PS, PSF, PPO, and the like, or thermosetting resins such as unsaturated polyester, polycarbonate, epoxy resin, polyurethane, and the like. The thermosetting resin is cured on the first solar cell 1 by heating or using a UV curing method. In response to hardness of the adhesive 6 on the first solar cell 1 falling in a preset hardness range by curing, the first solar cell 1 and the second solar cell 5 adjacent to the first solar cell 1 are welded to each other through the plurality of welding strips 4, to form an overlapped structure of solar cells connected by the welding strips 4, i.e. at least one cell string. The adhesive 6 may be applied to a front surface of the solar cell or to a rear surface of the solar cell. Moreover, there is a wide range of options for the types of the adhesive 6, it is required that a light transmittance of the adhesive 6 is not less than 91% and a difference from the light transmittance of the encapsulation layer is no more than 5%. Before the adhesive 6 cures, stripping resistance between solar cells is not greater than IN, and the stripping resistance is not greater than 3N once the adhesive 6 cures. The preset hardness of the adhesive 6 ranges from 20 ShoreA to 50 ShoreA, such as 20 ShoreA, 30 ShoreA, 40

ShoreA, and 50 ShoreA, the present disclosure does not specifically limit this, as long as the hardness of the adhesive 6 is enough to play a role of buffer when welding the welding strips 4 to the first solar cell 1.

There is no predetermined sequence between the completion of curing of the adhesive 6 and the start of welding, but rather it depends on the material properties of the adhesive. When the material of the adhesive 6 is relatively soft, welding is not performed until the hardness of the adhesive 6 falls in a preset hardness range by curing, to provide buffer to the welding strips 4 in the overlapping area on the first solar cell 1. When the hardness of the applied adhesive 6 is already within the preset hardness range, welding may be carried out first, and wait for the adhesive 6 to cure after welding, the cured adhesive 6 can solidify the welding strips 4 together. No matter in either case, when welding the welding strips 4, due to the presence of the adhesive 6 which has not cured to preset hardness, the welding strips 4 can be embedded in the adhesive 6, and be solidified in the adhesive 6 once the adhesive 6 cures. In other words, the welding strips 4 are surrounded by the adhesive 6. Therefore, when curing of the adhesive 6 completes, there is adhesive 6 between the welding strips 4 and the first solar cell 1, and between the welding strips 4 and the second solar cell 5. In this way, the first solar cell 1, the welding strips 4 and the second solar cell 5 are isolated from each other.

At S103, the at least one cell string is encapsulated using a front encapsulation layer, a front encapsulation material, a rear encapsulation layer and a rear encapsulation material, and in a direction from a front surface to a rear surface of the photovoltaic module, where the front encapsulation layer, the front encapsulation material, the at least one cell string, the rear encapsulation material and the rear encapsulation layer are stacked in sequence and laminated, to obtain the photovoltaic module.

In some embodiments, the front encapsulation layer is made of glass, the front and rear encapsulation materials are adhesive films, and the rear encapsulation layer is a rear plate or is made of glass. With the operations S101 and S102, an assembly of solar cells with a stable structure can be obtained. The front encapsulation layer, the front encapsulation material, the assembly of solar cells with stable structure, the rear encapsulation material and the rear encapsulation layer are stacked in sequence in a laminating machine, and the photovoltaic module according to the present disclosure can be obtained by lamination.

In the technical solution provided by the embodiments of the present disclosure, adhesive 6 is applied to the first area in the overlapping area of the first solar cell 1, and an overlapped structure of the first solar cell 1 and the second solar cell 5 connected by the plurality of welding strips 4 can be obtained after curing of the adhesive 6, and the plurality of welding strips 4 are separated from the first solar cell 1 and the second solar cell 5 by the adhesive 6. During lamination, the adhesive 6 can separate the plurality of welding strips 4 from solar cells and prevent the plurality of welding strips 4 from pressing on the solar cells. In this way, cracks in solar cells due to pressure from the welding strips 4 can be prevented.

Referring to FIG. 2, the method further includes improvement of applying area for the adhesive 6.

In some embodiments, as shown in FIG. 2, the first area includes a series of second areas 2 spaced apart from each other between two opposite edges of a solar cell (e.g., first solar cell 1), and each second area 2 of the series of second areas 2 aligns with a respective welding strip 4 of the plurality of welding strips 4. Each of two second areas 2 located at opposite ends of the series of second areas 2 is separated from a closer one of the two opposite edges of the solar cell (first solar cell 1) by a preset distance.

In some embodiments, the first area may be divided into a plurality of uniformly distributed sub-areas of uniform size, and each sub-area of the plurality of sub-areas, i.e. second areas, aligns with a respective welding strip 4 of the plurality of welding strips 4. In a direction perpendicular to the extension direction of the welding strips 4, a width of a second area 2 may be 1 to 5 times a width of a welding strips 4.

In some embodiments, because the first area may be divided into a plurality of second areas 2, the operation S101 may include the following operations.

At S100, the adhesive 6 is applied to a series of third areas 3 in the overlapping area of the respective solar cell (first solar cell 1). Each third area 3 of the series of third areas 3 is located between respective two adjacent second areas 2.

As shown in FIG. 2, each solar cell further includes a series of third areas 3, and each third area 3 of the series of third areas 3 is located between respective two adjacent second areas 2. In the direction perpendicular to the extension direction of the welding strips 4, a width of a third area 3 may be 5 to 100 times the width of a welding strips 4. The adhesive 6 may be applied concurrently to the series of second areas 2 and the series of third areas 3. In a vertical direction directing from the first solar cell 1 to the second solar cell 5, a thickness of the adhesive 6 in a third area 3 may be the same as or different from a thickness of the adhesive 6 in a second area 2. In this way, only the areas in the overlapping area excluding the series of second and series of third areas are not applied with the adhesive 6. A thickness of the adhesive 6 may ranges from 0.3 mm to 0.5 mm, such as 0.3 mm, 0.35 mm, 0.4 mm, 0.45 mm, 0.5 mm, the present disclosure does not specifically limit this.

By dividing the overlapping area into the series of second areas 2 and the series of third areas 3, and applying the adhesive 6 concurrently to the series of second areas 2 and the series of third areas 3, a respective area in the overlapping area aligning with each welding strip 4 and areas in the overlapping area between adjacent welding strips 4 are all applied with the adhesive 6. In this way, during lamination, forces applied on the overlapping areas of solar cells are more even, thereby preventing deformation of the solar cells due to uneven force.

In some embodiments, as shown in FIG. 3, the operation S101 includes operations S1011 and S1012. The plurality of solar cells involved in operation S101 are obtained by splitting one piece of solar cell, and a size of a longer edge of the one piece of solar cell is less than 10% larger than a size of a shorter edge of the one piece of solar cell.

At S1011, the one piece of solar cell is split to obtain the plurality of solar cells.

The plurality of solar cells involved in operation S101 are obtained by splitting one piece of solar cell, and the size of the longer edge of the one piece of solar cell is less than 10% larger than the size of the shorter edge of the one piece of solar cell. The one piece of solar cell may be split using laser to obtain the plurality of solar cells of an appropriate size.

At S1012, the adhesive 6 is applied to the first area in the overlapping area of the respective solar cell (first solar cell 1).

The first solar cell 1 is selected from the obtained plurality of solar cells and the adhesive 6 is applied to the first area of the first solar cell 1. In other words, at S101, splitting operation is previous to the applying operation of the adhesive 6.

Compared with the existing process that the splitting operation is immediately followed by overlapping and welding operation of solar cells, in the solutions provided by embodiments of the present disclosure, applying operation of the adhesive 6 is added after the splitting operation. In this way, during welding of the solar cells in series, the welding strips 4 do not directly press on solar cells but on the adhesive 6, and the adhesive 6 can play a role of buffer, thereby preventing cracks in an underlying solar cell due to the pressure from the welding strips 4 and an upper solar cell.

In some other embodiments, as shown in FIG. 4, the operation S101 includes operations S1013 and S1014. The plurality of solar cells involved in operation S101 are obtained by splitting one piece of solar cell, the one piece of solar cell has at least one applying area for applying the adhesive, and a size of a longer edge of the one piece of solar cell is less than 10% larger than a size of a shorter edge of the one piece of solar cell.

At S1013, the adhesive 6 is applied to the at least one applying area of the one piece of solar cell, and the at least one applying area corresponds to first areas of the plurality of solar cells.

The plurality of solar cells involved in operation S101 are obtained by splitting one piece of solar cell, and the size of the longer edge of the one piece of solar cell is less than 10% larger than the size of the shorter edge of the one piece of solar cell. The at least one applying area corresponding to first areas of the plurality of solar cells may be determined first on the one piece of solar cell, and the adhesive 6 is applied to the at least one applying area of the one piece of solar cell.

At S1014, the one piece of solar cell is split to obtain the plurality of solar cells, and the first area of each solar cell of the plurality of solar cells has the adhesive 6.

After applying the adhesive 6 to the at least one applying area of the one piece of solar cell, the one piece of solar cell may be split using laser to obtain the plurality of solar cells, and the first area of each solar cell of the plurality of solar cells has the adhesive 6. In other words, at S101, the applying operation of the adhesive 6 is previous to the splitting operation.

Compared with the existing process that the splitting operation is immediately followed by overlapping and welding operation of solar cells, in the solutions provided by embodiments of the present disclosure, applying operation of the adhesive 6 is added before the splitting operation. In this way, during welding of the solar cells in series, the welding strips 4 do not directly press on solar cells but on the adhesive 6, and the adhesive 6 can play a role of buffer, thereby preventing cracks in an underlying solar cell due to the pressure from the welding strips 4 and an upper solar cell.

Embodiments of the present disclosure further provide a photovoltaic module, including: a front encapsulation layer, a front encapsulation material, at least one cell string (referring to FIG. 5), a rear encapsulation material, and a rear encapsulation layer which are stacked in sequence in a direction from a front surface to a rear surface of the photovoltaic module. The at least one cell string includes a plurality of solar cells.

The at least one cell string may be obtained using the method as illustrated above.

Each respective solar cell of the plurality of solar cells has an overlapping area to be overlapped with a neighboring solar cell of the plurality of solar cells, and the respective solar cell has adhesive applied to first areas in the overlapping area. The first areas allow the respective solar cell to be welded to the neighboring solar cell through a plurality of welding strips 4 disposed at intervals between the respective solar cell and the neighboring solar cell, and each welding strip 4 of the plurality of welding strips 4 extends from the respective solar cell to the neighboring solar cell and traverses a respective first area. The respective solar cell is welded to the neighboring solar cell through the plurality of welding strips 4 to obtain at least one cell string. The plurality of welding strips 4 are separated from the respective solar cell and from the neighboring solar cell by the adhesive 6 in the first areas.

During processing of the plurality of solar cells in an overlapping order, a first solar cell may be selected as the first solar cell 1, and a next solar cell adjacent to the first solar cell 1 may be referred to a second solar cell 5. When process the second solar cell and a third solar cell adjacent to the second solar cell, the second and third solar cells form a new set of adjacent solar cells, in this case, the second solar cell 5 is referred to a first solar cell 1 of the new set of adjacent solar cells, and the third solar cell is referred to a second solar cell 5 of the new set of adjacent solar cells. Throughout the embodiments of the present disclosure, a first solar cell 1 denotes a random solar cell of the provided plurality of solar cells, rather than a specific solar cell of the plurality of solar cells.

In some embodiments, applying area, i.e. the first area, for the adhesive 6 is in the overlapping area for the edges of a solar cell and an adjacent solar cell, and a width of applied adhesive 6 is not greater than 3 mm, such as 1 mm, 1.5 mm, 2 mm, 2.5 mm or 3 mm, as long as the width is not greater than a width of the overlapping area, the present disclosure does not limit this. The adhesive 6 may be applied to a front surface of the solar cell or to a rear surface of the solar cell. Moreover, there is a wide range of options for the types of the adhesive 6, it is required that a light transmittance of the adhesive 6 is not less than 91%, a difference from the light transmittance of the encapsulation layer is no more than 5%, and the adhesive 6 belongs to insulating material. The adhesive 6 is not very sticky, before the adhesive 6 cures, stripping resistance between solar cells is not greater than IN, and the stripping resistance is not greater than 3N once the adhesive 6 cures. It is required that the fluidity of the adhesive 6 is low, such that the adhesive 6 not only can buffer the pressure during lamination of solar cells, but also would not overflow due to wobble of the solar cells after applying the adhesive.

In the photovoltaic module provided by embodiments of the present disclosure, the adhesive 6 is applied in the first area which aligns with the plurality of welding strips 4 traversing the overlapping area between the first solar cell 1 and the adjacent second solar cell 5, such that the plurality of welding strips 4 are separated from the first area in the overlapping area of the first solar cell 1 by the adhesive 6, and the plurality of welding strips 4 are separated from the second solar cell 5 by the adhesive 6. In this way, it can be ensured that the plurality of welding strips 4 press on a soft material during welding and embed in the adhesive 6, thereby preventing cracks in solar cells due to the pressure from the plurality of welding strips 4 during welding or lamination.

In some embodiments, as shown in FIG. 2, the first area includes a series of second areas 2 separated from each other, and each second area 2 of the series of second areas 2 aligns with a respective welding strip 4 of the plurality of welding strips 4. Each of two second areas 2 located at ends of the series of second areas 2 separates from a respective edge of the first solar cell 1 by a preset distance.

In some embodiments, the first area may be divided into a plurality of uniformly distributed sub-areas of uniform size, and each sub-area of the plurality of sub-areas, i.e. second areas 2, aligns with a respective welding strip 4 of the plurality of welding strips 4.

The overlapping area between two adjacent solar cells can be divided in a clearer way by further dividing the first area. Moreover, each of two second areas 2 located at ends of the series of second areas 2 separates from a respective edge of the first solar cell 1 by a preset distance, in this way, the adhesive 6 would not overflow due to being applied at the edge of the first solar cell.

In some embodiments, as shown in FIG. 2, each solar cell further includes a series of third areas 3 in the overlapping area, and each third area 3 of the series of third areas 3 is located between respective two adjacent second areas 2. The adhesive 6 is applied to the series of third areas 3 in the overlapping area of each solar cell.

Each solar cell further includes a series of third areas 3, and each third area 3 of the series of third areas 3 is located between respective two adjacent second areas 2. The adhesive 6 may be applied concurrently to the series of second areas 2 and the series of third areas 3. In a vertical direction directing from the first solar cell 1 to the second solar cell 5, a thickness of the adhesive 6 in a third area 3 may be the same as or different from a thickness of the adhesive 6 in a second area 2. In this way, only the areas in the overlapping area excluding the series of second and series of third areas are not applied with the adhesive 6. A thickness of the adhesive 6 may ranges from 0.3 mm to 0.5 mm, such as 0.3 mm, 0.35 mm, 0.4 mm, 0.45 mm. 0.5 mm, the present disclosure does not specifically limit this.

By dividing the overlapping area into the series of second areas 2 and the series of third areas 3, and applying the adhesive 6 concurrently to the series of second areas 2 and the series of third areas 3, a respective area in the overlapping area aligning with each welding strip 4 and areas in the overlapping area between adjacent welding strips 4 are all applied with the adhesive 6. In this way, during lamination, forces applied on the overlapping areas of solar cells are more even, thereby preventing deformation of the solar cells due to uneven force.

In some embodiments, as shown in FIG. 5, the overlapping area is located near at least one edge of each solar cell perpendicular to an extension direction of the plurality of welding strips 4, and a length of the overlapping area in the extension direction of the plurality of welding strips 4 ranges from 2 mm to 5 mm.

In the extension direction of the plurality of welding strips 4, each of the two solar cells located at ends of a cell string has only one edge overlapping with an adjacent solar cell, and each of other solar cells of the cell string has two edges overlapping with two adjacent solar cells, respectively. A length of the overlapping area in the extension direction of the plurality of welding strips 4 ranges from 2 mm to 5 mm, such as 2 mm, 3 mm, 4 mm, and 5 mm. In the extension direction of the plurality of welding strips 4, a length of the adhesive 6 applied in the overlapping area is not greater than the length of the overlapping area.

By setting the length of the overlapping area in the extension direction of the plurality of welding strips 4 in a range of 2 mm to 5 mm, a gap between two adjacent solar cells can be eliminated, and limited light receiving areas of solar cells can be fully utilized. In this way, the resulted photovoltaic module can have higher work efficiency and lower production costs.

In some embodiments, in the first area, a distance between the plurality of welding strips 4 and the respective solar cell is greater than a distance between the plurality of welding strips 4 and the neighboring solar cell.

Due to operational procedures and conventional practices, the first solar cell 1 is typically disposed below the second solar cell 5. After the first solar cell 1 is applied with the adhesive 6 and is welded with the plurality of welding strips 4, there is adhesive 6 of a preset thickness between the plurality of welding strips 4 and the first solar cell 1. Due to the soft nature of the adhesive 6 and that the adhesive 6 does not incompletely cure when welding, the welding strips 4 will get into the adhesive 6 due to pressure, which means that the welding strips 4 get into the adhesive from the second solar cell 5 towards the first solar cell 1. As the adhesive 6 gradually cures, the welding strips 4 will stop getting into the adhesive. Therefore, in the overlapping area, a distance between the plurality of welding strips 4 and the first solar cell 1 is usually greater than a distance between the plurality of welding strips 4 and the second solar cell 5.

In some embodiments, hardness of cured adhesive is greater than or equal to 20 shoreA and less than or equal to 50 shoreA.

The adhesive 6 may be an insulating adhesive, such as thermoplastic resins including PS, PSF, PPO, and the like, or thermosetting resins such as unsaturated polyester, polycarbonate, epoxy resin, polyurethane, and the like. Depending on types of the adhesive 6, the adhesive 6 may be cured by heating or using a UV curing method to control curing duration of the adhesive 6, such that the hardness of cured adhesive is greater than or equal to 20 shoreA and less than or equal to 50 shoreA, such as 20 ShoreA, 30 ShoreA, 40 ShoreA, and 50 ShoreA.

By setting the hardness of cured adhesive 6 in the range of 20 to 50 ShoreA, the adhesive 6 can have appropriate hardness, such that the plurality of welding strips 4 can be free of excessively getting into the adhesive 6, and a buffer force can be applied to the plurality of welding strips 4, thereby preventing cracks in solar cells due to the pressure from the plurality of welding strips 4 during lamination.

In some embodiments, a thickness of the adhesive 6 in the first area is not less than 0.3 mm and not greater than 0.5 mm.

As an example, a thickness of the adhesive 6 in the vertical direction directing from the first solar cell 1 to the second solar cell 5 may be 0.35 mm, 0.4 mm, or 0.45 mm.

By setting the thickness of the adhesive 6 in the range of 0.3 mm to 0.5 mm, the adhesive 6 can have an appropriate thickness, such that the adhesive 6 is thick enough to play a role of buffer, and deformation of solar cells during lamination due to excessive thickness of the adhesive 6 can be prevented. In this way, it can be ensured that the plurality of welding strips 4 press on a soft material during welding and embed in the adhesive 6, thereby preventing cracks in solar cells due to the pressure from the plurality of welding strips 4.

It should be noted that any of the technical features illustrated in the above embodiments of the present disclosure can be used in combination with the technical features in the following embodiments without contradiction.

Figure 6:
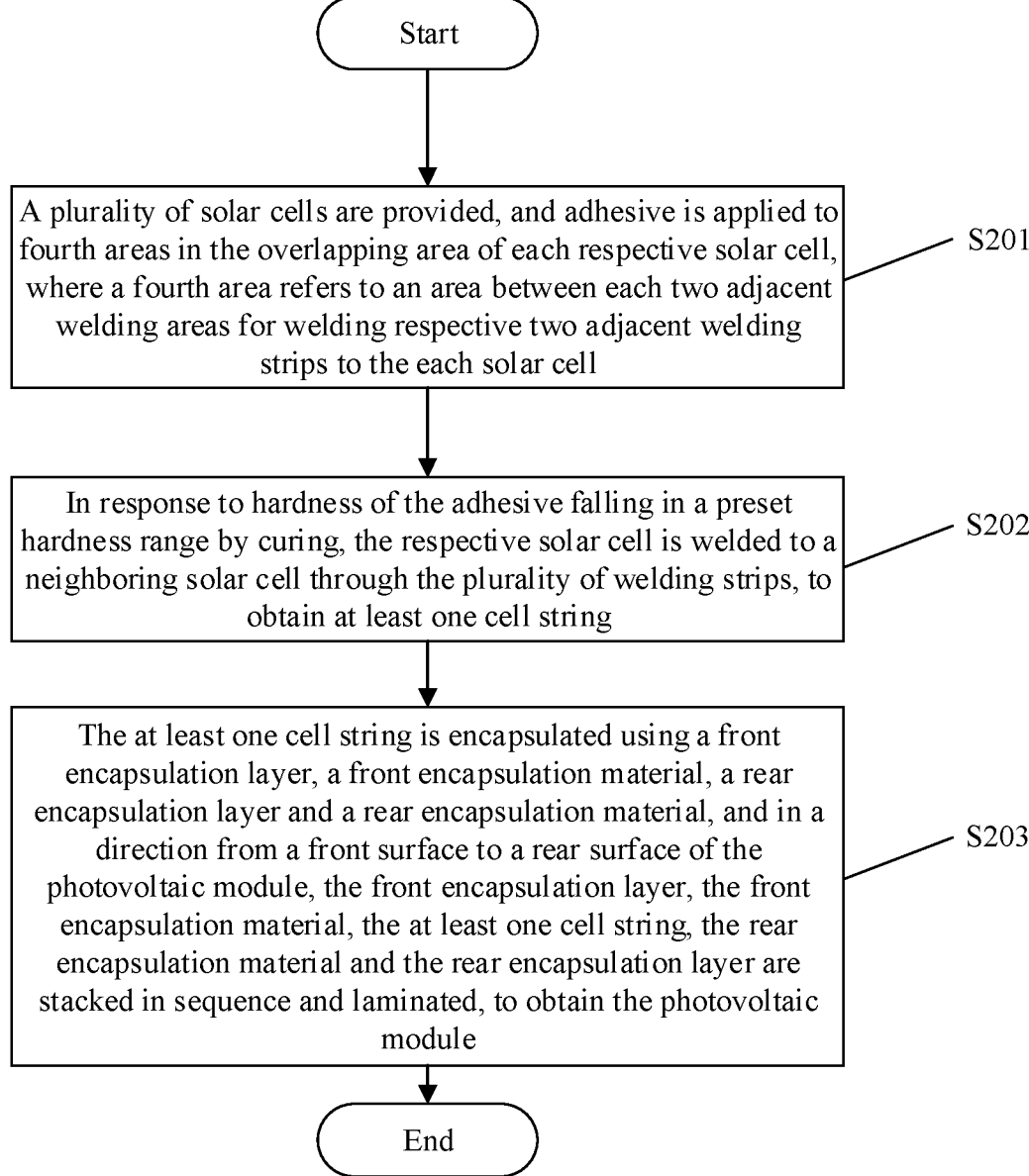
FIG. 6 is a fourth flow chart of the method for producing a photovoltaic module according to some embodiments of the present disclosure.

Embodiments of the present disclosure further provide a method for producing a photovoltaic module, referring to FIG. 6, the method includes the following operations.

At S201, a plurality of solar cells are provided, and adhesive 6 is applied to fourth areas 7 in the overlapping area of each respective solar cell of the plurality of solar cells. A plurality of welding strips are disposed at intervals between the respective solar cell and a neighboring solar cell, and each welding strip of the plurality of welding strips extends from the each solar cell to the respective solar cell and traverses the overlapping area, where a fourth area 7 refers to an area between each two adjacent welding areas for welding respective two adjacent welding strips 4 to the first solar cell 1. In an extension direction of a welding strip 4, a length of applied adhesive 6 is not greater than a length of the overlapping area, and a thickness of the adhesive 6 is not less than a thickness of a welding strip 4.

At S202, in response to hardness of the adhesive 6 falling in a preset hardness range by curing, welding the respective solar cell (first solar cell 1) to the neighboring solar cell (second solar cell 5) through the plurality of welding strips 4, to obtain at least one cell string.

The illustration of the first solar cell 1, the second solar cell 5, the overlapping area, and welding process for the plurality of welding strips 4 in the embodiments of the previous method corresponding to FIG. 1 is applicable to this method. A fourth area 7 (is analogous to the third area 3 in FIG. 2) refers to an area between each two adjacent welding areas for welding respective two adjacent welding strips 4 to the first solar cell 1. Application areas for the adhesive 6 change accordingly, in other words, the adhesive 6 is applied only in the fourth areas 7.

At S203, the at least one cell string is encapsulated using a front encapsulation layer, a front encapsulation material, a rear encapsulation layer and a rear encapsulation material, and the front encapsulation layer, the front encapsulation material, the at least one cell string, the rear encapsulation material and the rear encapsulation layer are stacked in sequence in a direction from a front surface to a rear surface of the photovoltaic module. This operation is analogous to the above operation S103.

By applying the adhesive 6 in the fourth areas, cured adhesive 6 can support the respective area between each two adjacent welding strips 4, thereby prevent cracks in solar cells due to uneven force on the solar cells during lamination.

Figure 7:
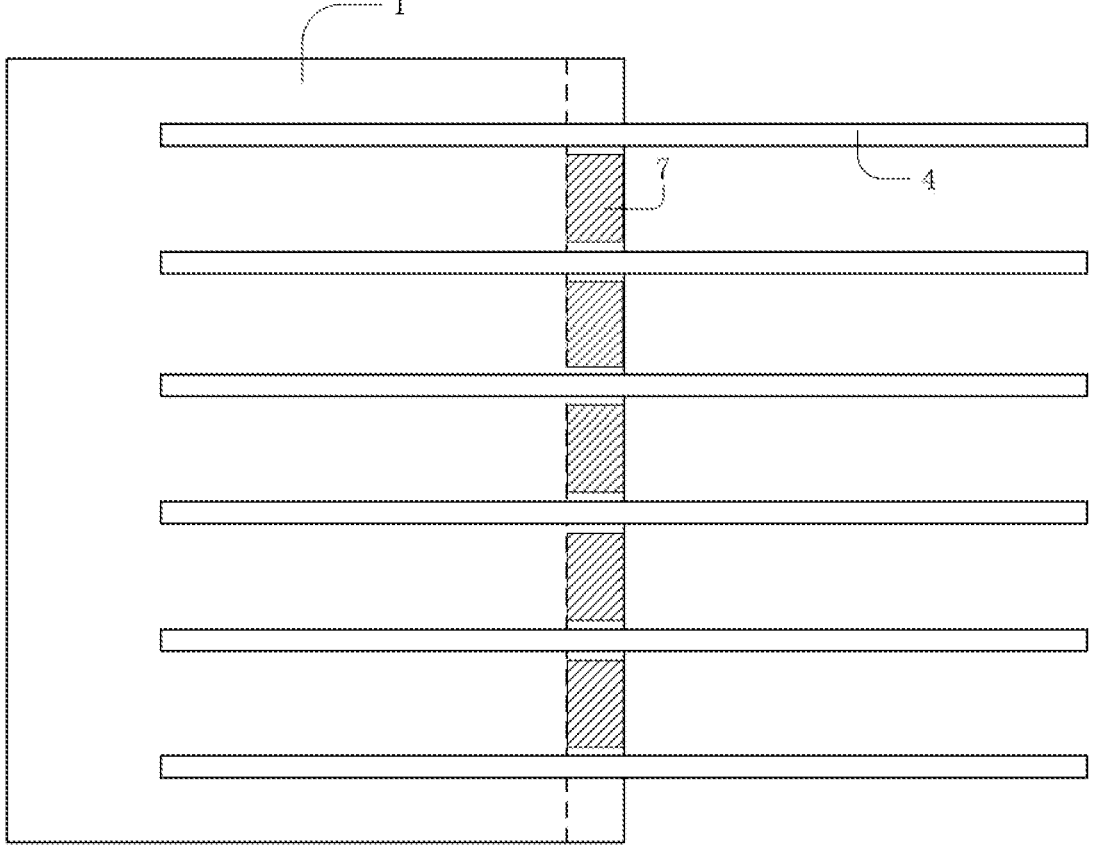
FIG. 7 is a second schematic diagram of an overlapping area of the first solar cell according to some embodiments of the present disclosure.

Embodiments of the present disclosure further provide a photovoltaic module corresponding to the method as shown in FIG. 6, and the photovoltaic module may be implemented by performing the operations of the method as shown in FIG. 6. The photovoltaic module includes: a front encapsulation layer, a front encapsulation material, at least one cell string (referring to FIG. 7), a rear encapsulation material, and a rear encapsulation layer which are stacked in sequence in a direction from a front surface to a rear surface of the photovoltaic module. The at least one cell string includes a plurality of solar cells. Each respective solar cell of the plurality of solar cells has adhesive 6 applied to the fourth areas 7. The respective solar cell is welded to the neighboring solar cell through the plurality of welding strips 4 to obtain at least one cell string, and each welding strip 4 of the plurality of welding strips 4 extends from the respective solar cell to the neighboring solar cell and traverses the overlapping area. The plurality of welding strips 4 are separated from the respective solar cell (first solar cell 1) and from the neighboring solar cell (second solar cell 5) by the adhesive 6 in the fourth areas 7. A fourth area 7 refers to an area between each two adjacent welding areas for welding respective two adjacent welding strips 4 to the first solar cell 1. In an extension direction of a welding strip 4, a length of applied adhesive 6 is not greater than a length of a fourth area, and a thickness of the adhesive 6 is not less than a thickness of a welding strip 4.

By applying the adhesive 6 in the fourth areas, cured adhesive 6 can support the respective area between each two adjacent welding strips 4, thereby prevent cracks in solar cells due to uneven force on the solar cells during lamination.

Embodiments of the present disclosure further provide a method for producing a photovoltaic module, including the following operations.

At S301, a plurality of solar cells are provided and disposed in a non-overlapped manner, and adhesive 6 is applied to a fifth area of each respective solar cell, where the fifth area is configured for the respective solar cell and a neighboring solar cell to be welded to each other in the fifth area through a plurality of welding strips 4 disposed at intervals between the respective solar cell and the neighboring solar cell, and each welding strip 4 of the plurality of welding strips 4 extends from the respective solar cell to the neighboring solar cell and traverses the fifth area.

In some embodiments, a width of the fifth area in an extension direction of the plurality of welding strips 4 ranges from 0.1 mm to 50 mm, such as 1 mm, 2 mm, 3 mm, 5 mm, 10 mm, 20 mm, 30 mm, or 40 mm. For the purpose of saving materials, the fifth area may include a series of sixth areas 8 separated from each other, and each sixth areas 8 of the series of sixth areas 8 aligns with a respective welding strip 4 of the plurality of welding strips 4. In some other embodiments, the adhesive 6 having a same thickness in a vertical direction directing from the first solar cell 1 to the second solar cell 5 is applied to the series of sixth areas 8 and a series of seventh areas 9 of the first solar cell 1. Each seventh area 9 of the series of seventh areas 9 is located between respective two adjacent sixth areas 8, and is analogous to the third area 3 in FIG. 2.

The illustration of the first solar cell 1, the second solar cell 5, welding process for the plurality of welding strips 4 and the series of sixth areas 8 in the embodiments of the preceding method corresponding to FIG. 1 is applicable to this method. Difference between the preceding method and the present method lies in that in the embodiments of the present method, the plurality of solar cells are not disposed in an overlapped manner (in other words, in a tiled manner) and therefore there is no overlapping area. The series of sixth areas 8 (are analogous to the series of second areas 2 in FIG. 2) of the first solar cell 1 refers to the areas in the fifth area to be welded with the plurality of welding strips 4. Application areas for the adhesive 6 change accordingly, in other words, the adhesive 6 is applied only to the fifth area, or to the series of sixth areas 8 in the fifth area, or to the series of sixth areas 8 and the series of seventh areas 9 in the fifth area.

At S302, in response to hardness of the adhesive 6 falling in a preset hardness range by curing, the respective solar cell (first solar cell 1) and the neighboring solar cell (second solar cell 5) are welded to each other through the plurality of welding strips 4, to obtain at least one cell string.

At S303, the at least one cell string is encapsulated using a front encapsulation layer, a front encapsulation material, a rear encapsulation layer and a rear encapsulation material, and the front encapsulation layer, the front encapsulation material, the at least one cell string, the rear encapsulation material and the rear encapsulation layer are stacked in sequence in a direction from a front surface to a rear surface of the photovoltaic module and laminated, to obtain the photovoltaic module.

In the photovoltaic module whose solar cells are disposed in a non-overlapped manner, a maximum pressure on a solar cell during lamination occurs at the welding strips 4. By applying the adhesive 6 at the welding strips 4, the solar cell has a protective layer at the welding strips 4, thereby preventing cracks in the solar cell during lamination due to excessive stress at the welding strips 4.

Figure 10:
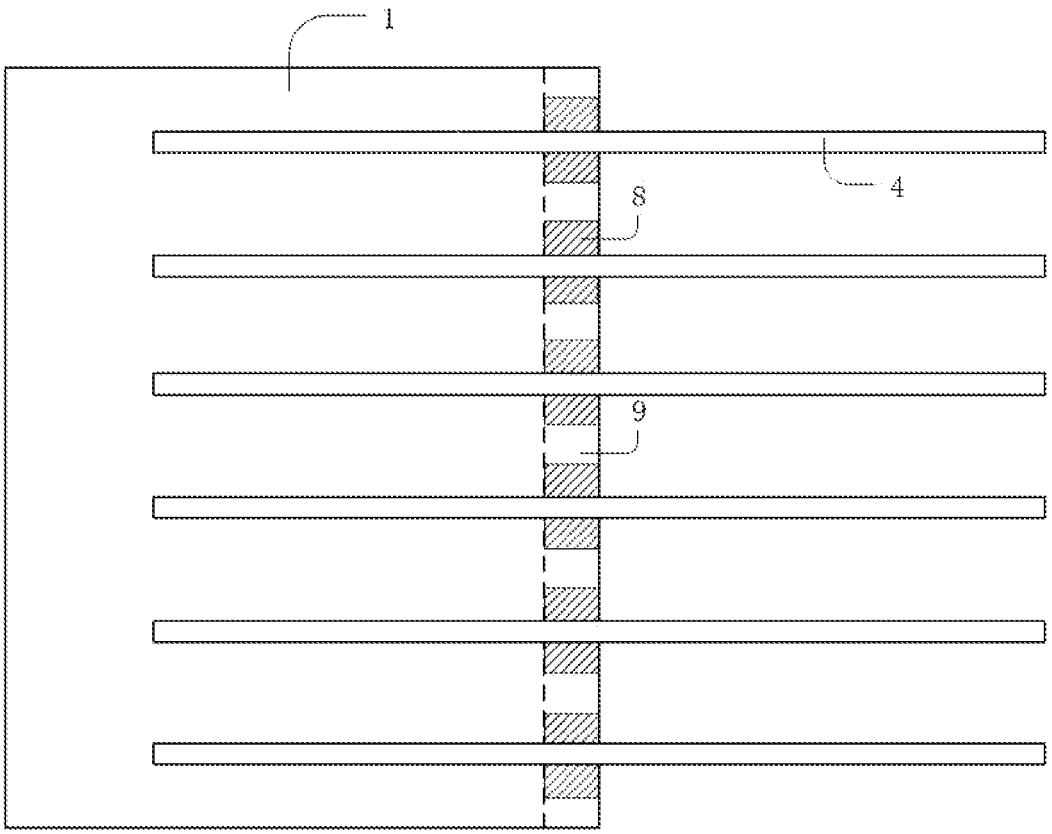
FIG. 10 is a schematic diagram of an edge area of the first solar cell according to some embodiments of the present disclosure.

Embodiments of the present disclosure further provide a photovoltaic module corresponding to the method as shown in FIG. 8, and the photovoltaic module may be implemented by performing the operations of the method as shown in FIG. 8. The photovoltaic module includes: a front encapsulation layer, a front encapsulation material, at least one cell string (referring to FIGS. 9 and 10), a rear encapsulation material, and a rear encapsulation layer which are stacked in sequence in a direction from a front surface to a rear surface of the photovoltaic module. The at least one cell string includes a plurality of solar cells disposed in a non-overlapped manner, and a plurality of welding strips 4 disposed in parallel and at intervals between each respective solar cell of the plurality of solar cells and a neighboring solar cell, and each welding strip 4 of the plurality of welding strips 4 extends from the respective solar cell to the neighboring solar cell. The adhesive 6 is applied to a fifth area of each respective solar cell, where the fifth area is configured for the respective solar cell and the neighboring solar cell to be welded to each other in the fifth area through the plurality of welding strips 4.

In some embodiments, a width of the fifth area in an extension direction of the plurality of welding strips 4 ranges from 0.1 mm to 50 mm. For the purpose of saving materials, the fifth area may include a series of sixth areas 8 separated from each other, and each sixth areas 8 of the series of sixth areas 8 aligns with a respective welding strip 4 of the plurality of welding strips 4. In some other embodiments, the adhesive 6 of a same thickness or different thicknesses is applied to the series of sixth areas 8 and a series of seventh areas 9 of the first solar cell 1. Each seventh area 9 of the series of seventh areas 9 is located between respective two adjacent sixth areas 8, and is analogous to the third area 3 in FIG. 2. In some embodiments, the adhesive 6 is applied only to the series of sixth areas 8 of each solar cell.

In the photovoltaic module whose solar cells are disposed in a non-overlapped manner, a maximum pressure on a solar cell during lamination occurs at the welding strips 4. By applying the adhesive 6 at the welding strips 4, the solar cell has a protective layer at the welding strips 4, thereby preventing cracks in the solar cell during lamination due to excessive stress at the welding strips 4.

Those having ordinary skill in the art shall understand that the above embodiments are exemplary implementations for realizing the present disclosure. In practice, any person skilled in the art to which the embodiments of the present disclosure belong may make any modifications and changes in forms and details without departing from the scope of the present disclosure.

What is claimed is:

1. A photovoltaic module, comprising:
a front encapsulation layer;
a front encapsulation material;
at least one cell string;
a rear encapsulation material; and
a rear encapsulation layer;

wherein the front encapsulation layer, the front encapsulation material, the at least one cell string, the rear encapsulation material and the rear encapsulation layer are stacked in sequence in a direction from a front surface to a rear surface of the photovoltaic module, and the at least one cell string includes a plurality of solar cells;

wherein a respective solar cell of the plurality of solar cells has an overlapping area to be overlapped with a neighboring solar cell of the plurality of solar cells, and the respective solar cell has an adhesive applied to first areas in the overlapping area;

wherein the first areas allow the respective solar cell to be welded to the neighboring solar cell through a plurality of welding strips disposed at intervals between the respective solar cell and the neighboring solar cell, and a respective welding strip of the plurality of welding strips extends from the respective solar cell to the neighboring solar cell and traverses a respective first area;

wherein the respective solar cell is welded to the neighboring solar cell through the plurality of welding strips to obtain at least one cell string;

wherein the plurality of welding strips are separated from the respective solar cell and from the neighboring solar cell by the adhesive in the first areas;

wherein the first areas are arranged at intervals along a direction that extends between opposite first and second edges of the solar cell, and a respective first area of the first areas corresponds to a respective welding strip of the plurality of welding strips and is separated from a neighboring first area of the first areas by an area of the overlapping area that is not covered by the adhesive; and wherein a first area of the first areas that is closest to the first edge is separated from the first edge by an area of the overlapping area that is not covered by the adhesive, and a first area of the first areas that is closest to the second edge is separated from the second edge by an area of the overlapping area that is not covered by the adhesive.

2. The photovoltaic module according to claim 1, wherein the respective solar cell further includes a series of second areas, and each second area of the series of second areas is located between respective two adjacent first areas.

3. The photovoltaic module according to claim 1, wherein the overlapping area is located near at least one edge of the respective solar cell perpendicular to an extension direction of the plurality of welding strips, and a length of the overlapping area in the extension direction of the plurality of welding strips ranges from 2 mm to 5 mm.

4. The photovoltaic module according to claim 1, wherein in the first areas, a distance between the plurality of welding strips and the respective solar cell is greater than a distance between the plurality of welding strips and the neighboring solar cell.

5. The photovoltaic module according to claim 1, wherein hardness of the adhesive is greater than or equal to 20 shoreA and less than or equal to 50 shoreA.

6. The photovoltaic module according to claim 1, wherein a thickness of the adhesive in the first areas is not less than 0.3 mm and not greater than 0.5 mm.

7. The photovoltaic module according to claim 1, wherein the adhesive is an insulating adhesive.

8. The photovoltaic module according to claim 2, wherein a width of a first area of the series of first areas is 1 to 5 times a width of a welding strip of the plurality of welding strips, and a width of a second area of the series of second areas is 5 to 100 times the width of the welding strip of the plurality of welding strips.

9. The photovoltaic module according to claim 1, wherein the first areas include a plurality of fourth areas;

wherein one respective fourth area of the plurality of fourth areas refers to an area between two corresponding adjacent welding areas for welding strips.

10. The photovoltaic module according to claim 1, wherein the overlapping area has a width that is in a range of 0.3 mm to 2 mm.

11. The photovoltaic module according to claim 1, wherein the adhesive has a light transmittance greater than or equal to 91% and different from a light transmittance of the encapsulation layer by no more than 5%.

12. The photovoltaic module according to claim 1, wherein the adhesive has a stripping resistance less than or equal to 3N.

13. The photovoltaic module according to claim 7, wherein the adhesive is a thermoplastic resin.

14. The photovoltaic module according to claim 7, wherein the adhesive is a thermosetting resin.

\*    \*    \*    \*    \*